(12) United States Patent
Shibasaki et al.

(10) Patent No.: US 8,120,246 B2
(45) Date of Patent: Feb. 21, 2012

(54) DISPLAY DEVICE WITH IMPROVED MOISTURE PREVENTION AND PRODUCTION METHOD FOR THE SAME

(75) Inventors: Takanori Shibasaki, Kanagawa (JP); Mitsuru Asano, Kanagawa (JP)

(73) Assignee: Sony Corporation, Tokyo (JP)

( * ) Notice: Subject to any disclaimer, the term of this patent is extended or adjusted under 35 U.S.C. 154(b) by 463 days.

(21) Appl. No.: 11/084,957

(22) Filed: Mar. 21, 2005

(65) Prior Publication Data

US 2005/0206309 A1 Sep. 22, 2005

(30) Foreign Application Priority Data

Mar. 22, 2004 (JP) ................ P2004-082477

(51) Int. Cl.
*H01L 51/00* (2006.01)
(52) U.S. Cl. ............... 313/506; 313/504; 313/505
(58) Field of Classification Search .......... 313/498–512; 428/690–691, 917; 445/23–25; 315/169.1; 438/26–29, 34, 82; 257/40, 72, 98–100, 257/642–643, 759; 427/66, 532–535, 539
See application file for complete search history.

(56) References Cited

U.S. PATENT DOCUMENTS

| | | | | |
|---|---|---|---|---|
| 5,643,407 A * | 7/1997 | Chang | ............... | 438/623 |
| 2002/0008467 A1 * | 1/2002 | Nagayama et al. | ............... | 313/506 |
| 2002/0153831 A1 * | 10/2002 | Sakakura et al. | ............... | 313/504 |
| 2003/0194484 A1 * | 10/2003 | Yamazaki et al. | ............... | 427/66 |
| 2004/0251827 A1 * | 12/2004 | Kang et al. | ............... | 313/512 |
| 2005/0008894 A1 * | 1/2005 | Hiruma et al. | ............... | 428/690 |
| 2006/0061268 A1 * | 3/2006 | Nakanishi | ............... | 313/506 |

FOREIGN PATENT DOCUMENTS

| | | | |
|---|---|---|---|
| JP | 61-179698 | | 8/1986 |
| JP | 4017393 | * | 1/1992 |
| JP | 2002-318556 | | 10/2002 |
| JP | 2004-055530 | | 2/2004 |

OTHER PUBLICATIONS

Japanese Office Action issued on Jun. 8, 2010 in connection with counterpart Japanese Patent Application No. 2004-082477.

* cited by examiner

*Primary Examiner* — Joseph L Williams
*Assistant Examiner* — Fatima Farokhrooz
(74) *Attorney, Agent, or Firm* — SNR Denton US LLP

(57) ABSTRACT

A display device and a production method for the display device having a pixel region formed by arraying a plurality of pixels each having an organic layer held by a lower electrode and an upper electrode on a substrate are provided. The production method for the display device of the invention includes, in one embodiment, a first step of forming a first insulating film on the substrate, a second step of forming a plurality of such lower electrodes each corresponding to each of the pixels on the first insulating film in the pixel region, forming a conductive film on the first insulating film in a peripheral region outside the pixel region, and forming a hole, in the conductive film, which extends to the first insulating film, and a third step of performing a bake treatment on the substrate on which the lower electrode and the conductive film are provided.

12 Claims, 7 Drawing Sheets

DISPLAY DEVICE WITH IMPROVED MOISTURE PREVENTION AND PRODUCTION METHOD FOR THE SAME

BACKGROUND OF THE INVENTION

1. Field of the Invention

The present invention relates to display devices and production methods for the display devices and, particularly, to a display device comprising an organic electro-luminescence device (hereinafter, referred to also as "organic EL device") and a production method for the display device.

2. Description of the Related Art

An organic EL device, comprising an organic layer including a light-emitting layer held by a lower electrode and an upper electrode, has attracted an attention as a light-emitting device capable of emitting light having a high luminance by a low voltage DC driving.

An active matrix type display device comprising an organic EL device (namely, an organic EL display) comprises a thin film transistor (hereinafter, referred to also as "TFT" for short) in each pixel on a substrate. The organic EL device which comes to be each pixel is constituted by a lower electrode subjected to patterning per pixel in a state of being connected to the TFT, an organic layer provided on the lower electrode and an upper electrode provided covering the organic layer. Among these components, the upper electrode is formed, for example, as an allover film covering a plurality of pixels and is used as an electrode common to the plurality of pixels.

In order to secure an opening factor of the organic EL device in the active matrix type display device, it is effective to adopt a top-emitting type. To this end, in order to secure light transmissive characteristics, a transparent conductive oxide such as indium tin oxide (ITO) and indium zinc oxide (IZO) or a film of MgAg so thin as to have a light transmission property may be used in the upper electrode; however, these materials have a high sheet resistance, to thereby cause a voltage drop. Further, at the time of enlarging a size of the organic EL device or attaining a high luminance thereof, there is a tendency of increasing the voltage drop as drive current is increased.

In order to prevent reduction of luminance or unevenness of luminance in a plane such as display unevenness of the organic EL display which is caused by the increase of the voltage drop or the like, an example of the display device in which an auxiliary wiring made of metallic material is formed on a first insulating film among pixel openings and on the first insulating film outside a pixel region and, then, the upper electrode is connected to an auxiliary electrode is reported.

An example of the display device provided with such auxiliary wiring as described above is shown in FIG. 8. The display device 10 is a top-emitting type organic EL display and comprises a pixel region A in which pixels, namely, organic EL devices (not shown) are arrayed on a substrate 11. On this occasion, an example in which a conductive film 31 is disposed, as an auxiliary wiring, in a state of a frame surrounding the pixel region A in a peripheral region B outside the pixel region A is explained. The conductive film 31 is connected to a driver circuit 12 provided at an end portion of the substrate 11 and is connected to the upper electrode (not shown) common to pixels. FIGS. 9A and 9B each show a cross-sectional view taken on line X-X' of FIG. 8.

Conventionally, in a production method for a display device having such constitution as described above, a first insulating film 14 and a second insulating film 17 are each ordinarily formed by an organic insulating film made of, for example, polybenzoxazole and, then, have a tendency of containing moisture and the like. Accordingly, by performing a bake treatment on the film after being formed, the film is cured and the moisture and the like contained therein are removed. However, in a case in which the conductive film 31 as an auxiliary wiring is formed on the first insulating film 14 in the peripheral region B of the substrate 11, at the time of performing the bake treatment on the second insulating film 17 after being formed, the conductive film 31 is in a state of covering the first insulating film 14. To this end, degassing of the moisture and the like which remain in the first insulating film 14 is not sufficiently performed.

Accordingly, deterioration is gradually progressed with the organic EL device 32 starting from that in the periphery of the pixel region A and a non-light-emission defect is sometimes generated or a luminescence life time is sometimes shortened.

Further, along with the deterioration of the organic EL device 32, drive voltage sometimes becomes high.

In order to remove the moisture and the like in an assured manner from the first insulating film 14 covered by the conductive film 31, it is necessary to perform a bake treatment under a condition of a high temperature or for a long time period and, accordingly, yield is not favorable.

SUMMARY OF THE INVENTION

In order to solve the above-described problems, a first production method for a display device according to the present invention is a production method for a display device which has a pixel region formed by arraying a plurality of pixels each having an organic layer held by a lower electrode and an upper electrode on a substrate and comprises performing the steps as described below in order. Firstly, a first insulating film is formed on the substrate. Next, a plurality of such lower electrodes each corresponding to each of the pixels are formed on the first insulating film in the pixel region, a conductive film is formed on the first insulating film outside the pixel region and, then, a hole which extends to the first insulating film is formed in the conductive film. Thereafter, a bake treatment is performed on the substrate on which the lower electrode and the conductive film are provided.

Further, a first display device according to the present invention to be obtained by the first production method is a display device which has a pixel region formed by arraying a plurality of pixels each having an organic layer held by a lower electrode and an upper electrode on a substrate and comprises a first insulating film provided on the substrate, a plurality of such lower electrodes each corresponding to each of the pixels provided on the first insulating film in the pixel region, and a conductive film, being provided on the first insulating film outside the pixel region, in which a hole extending to the first insulating film is provided.

According to the first production method for the display device and the first display device to be obtained thereby, by performing the bake treatment after the hole which extends to the first insulating film is formed on the conductive film, moisture and the like contained in the first insulating film which is an underlayer of the conductive film is removed by being released through the hole. To this end, for example, the above-described conductive film is provided as an auxiliary wiring and, even when the conductive film is formed in a state of having a large area, the moisture and the like is prevented from remaining in the first insulating film which is an underlayer of the conductive film and, accordingly, deterioration of the pixel, namely, the organic EL device to be caused by the moisture and the like is prevented.

Further, a second production method for a display device according to the present invention is a production method for a display device which has a pixel region formed by arraying a plurality of pixels each having an organic layer held by a lower electrode and an upper electrode on a substrate and comprises performing the steps as described below in order. Firstly, the step of forming a plurality of such lower electrodes each corresponding to each of the pixels on the substrate is performed. Next, the step of forming a first insulating film on the substrate covering the lower electrodes and, then, forming a pixel opening, in the first insulating film, which allows a surface of each of the lower electrodes to be exposed is performed. Thereafter, the step of forming a conductive film on the first insulating film outside the pixel region and, then, forming a hole, in the conductive film, which extends to the first insulating film is performed. Subsequently, a bake treatment is performed on the substrate provided with the conductive film.

Further, a second display device according to the present invention to be obtained by the second production method is a display device which has a pixel region formed by arraying a plurality of pixels each having an organic layer held by a lower electrode and an upper electrode on a substrate and comprises a plurality of such lower electrodes each corresponding to each of the pixels provided on the substrate in the pixel region, a first insulating film, being provided on the substrate, in which a pixel opening which allows each of such lower electrodes to be exposed is provided and a conductive film, being provided on the first insulating film outside the pixel region, in which a hole which extends to the first insulating film is formed.

According to the second production method for such display device and the second display device to be obtained thereby, by performing a bake treatment after the hole which extends to the first insulating film is formed in the conductive film, at the time of the bake treatment, moisture and the like contained in the first insulating film which is an underlayer of the conductive film is degassed through this hole. To this end, for example, the above-described conductive film is provided as an auxiliary wiring and, even when the conductive film is formed in a state of having a large area, the moisture and the like is prevented from remaining in the first insulating film which is an underlayer of the conductive film and, accordingly, deterioration of the organic EL device to be caused by the moisture and the like is prevented.

As has been described above, according to the production method for the display device of the present invention and the display device to be obtained thereby, since the deterioration of the organic El device to be caused by the moisture and the like remaining in the first insulating film is prevented, not only the number of the non-light-emitting defects of the organic EL devices can be reduced but also a luminescence life time can be prolonged and also the drive voltage can be maintained at a low level. Further, even when the bake treatment is not performed under the condition of a high temperature and for a long time period, since the moisture and the like contained in the first insulating film is removed in an assured manner, productivity can be enhanced.

DESCRIPTION OF THE PREFERRED EMBODIMENTS

Figure 1A:
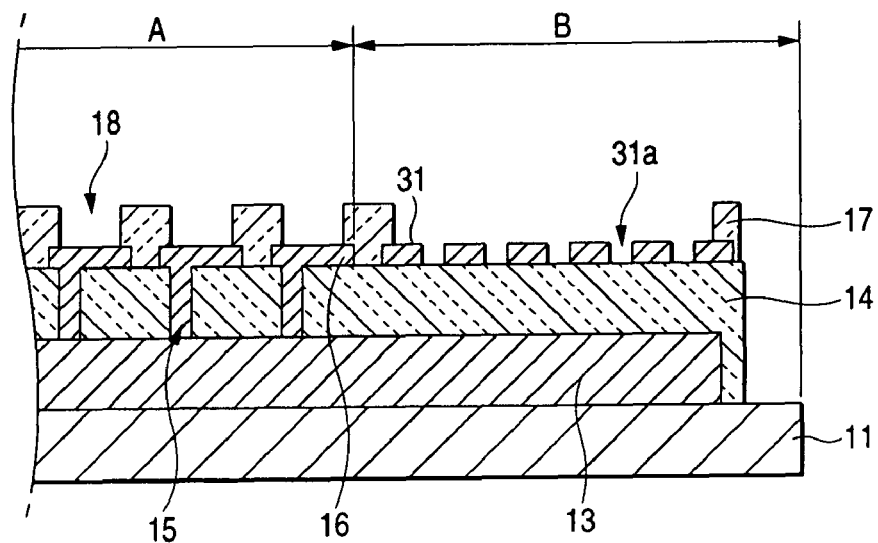
FIGS. 1A and 1B are a cross-sectional view and a top view, respectively, for explaining a first embodiment according to a production method for a display device of the present invention.

Hereinafter, the present invention will be described in detail with reference to the preferred embodiments shown in the accompanying drawings.

First Embodiment

Taking a top-emitting type organic EL display as an example, a detailed constitution of each member is described in the order of production steps. Same constitutions as those described in BACKGROUND OF THE INVENTION are explained by giving them with same reference numerals and signs.

Firstly, as shown in FIG. 1A, a TFT array 13 formed by arraying a plurality of TFT's is formed on a substrate 11 made of an insulating material such as glass. Next, on the substrate 11 on which the TFT array 13 is formed, a first insulating film 14 comprising a positive type photosensitive polybenzoxazole is formed by coating, for example, a spin coat method. The thus-formed first insulating film 14 functions as a flattening film which flattens unevenness generated on a surface side of the substrate 11. Further, on this occasion, although polybenzoxazole is used in the first insulating film 14, any of other insulating materials such as positive type photosensitive polyimides may be used therein.

Thereafter, the first insulating film 14 is subjected to exposure and, then, to development, to thereby form a contact hole 15 in the first insulating film 14 for connecting to the TFT. Subsequently, the resultant substrate 11 is subjected to a bake treatment in an atmosphere of an inert gas such as $N_2$ gas, to thereby not only cure the first insulating film 14 comprising polybenzoxazole but also remove moisture and the like contained in the first insulating film 14.

Next, in a manner of filling the contact hole 15, an ITO film, an Ag alloy film, and an ITO film are laminated in the stated order from the side of the substrate 11, to thereby form a conductive material layer (not shown) on the first insulating film 14. Thickness of the thus-formed conductive material layer is allowed to be such that, for example, an ITO film/an Ag alloy film/an ITO film are about 30 nm/about 100 nm/about 10 nm from the side of the substrate 11. On this occasion, the Ag alloy film comes to be a reflection layer of a lower electrode which is formed by subjecting the conductive material layer to patterning at a post-step.

Then, patterning is performed on the conductive material layer by etching while using a resist pattern (not shown) formed by an ordinary lithography technique as a mask. By this patterning, the conductive material layer is connected to TFT on the first insulating film 14 in a pixel region A via the contact hole 15, lower electrodes 16 each corresponding to each of the pixels are formed in an array manner and a conductive film 31 is formed on the first insulating film 14 in a peripheral region B outside the pixel region A. The conductive film 31 is formed in a width of about 3 mm in a state of a frame which surrounds the pixel region A and, at the same time, allowed to be connected to a driver circuit (not shown). On this occasion, the conductive film 31 functions as an auxiliary wiring and is connected to an upper electrode to be formed at a post-step, to thereby decrease wiring resistance and, due to these features, the conductive film 31 is provided for the purpose of enhancing luminance and obtaining a favorable inner-plane luminance distribution. For this account, the conductive film 31 is preferably formed of a material excellent in conductivity and, also preferably, in a large width.

Figure 1B:
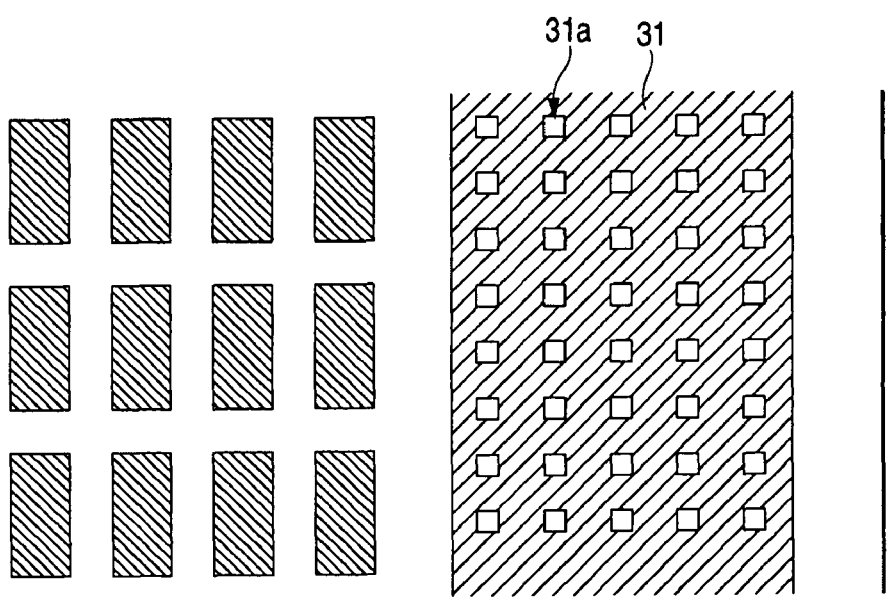

Then, a plurality of holes 31a extending to the first insulating film 14 are formed in the conductive film 31. On this occasion, as shown in FIG. 1B, these holes 31a are each formed, for example, in a rectangular shape having a size of 20.mu.m.times.20.mu.m in both width and length directions with a space of 100 μm between any two adjacent holes in the conductive film 31.

Figure 2:
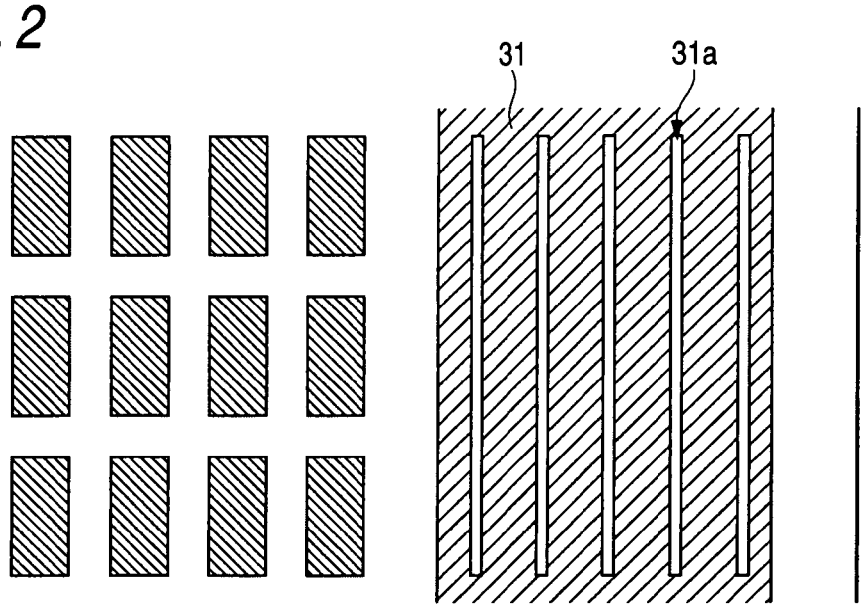
FIG. 2 is a top view for explaining a first embodiment according to a production method for a display device of the present invention.

The holes 31a assume a role of release-removing the moisture and the like contained in the first insulating film 14 which is an underlayer of the conductive film 31 at the time of performing the bake treatment on the second insulating film 17 (refer to FIG. 1A) to be formed in a patterned manner on the first insulating film 14 (refer to FIG. 1A) at a post-step. On this occasion, the plurality of holes 31a are arranged to be in an array formation in the conductive film 31, but, even when the hole 31a in a rectangular shape having a size, for example, of 20 μm×20 μm is singly present, the moisture and the like contained in the first insulating film 14 in the periphery of the holes 31a are removed. However, in order to remove the moisture and the like remaining in the first insulating film 14 in an assured manner, an opening area of the hole 31a is preferably allowed to be wide and the number of the holes are preferably allowed to be as many as possible within a range in which the reduction of the voltage decrease to be generated after the upper electrode and the conductive film 31 are connected can be suppressed. Further, it is preferable that the holes 31a are evenly arranged over an entire area of the conductive film 31. Still further, shapes of the holes 31a are not particularly limited and, as shown in FIG. 2, may each be formed in a slit shape in the conductive film 31.

Next, as shown in FIG. 1A, a second insulating film 17 comprising positive type photosensitive polybenzoxazole is formed by coating, for example, a spin coat method on the first insulating film 14 on which the lower electrode 16 and the conductive film 31 are provided. Then, the thus-formed second insulating film 17 is subjected to exposure, development and curing and, then, a pixel opening 18 for forming each pixel, namely, an organic EL device in the pixel region A is formed and, thereafter, a surface of the lower electrode 16 is allowed to be exposed and, also, a surface of the conductive film 31 in the peripheral region B is allowed to be exposed. At this occasion, an end portion of the conductive film 31 is allowed to be covered by the second insulating film 17. By such arrangement as described above, the second insulating film 17 not only functions as a device separating film for separating pixels from one another but also functions as a protective film covering the end portion of the conductive film 31. On this occasion, the second insulating film 17 corresponds to a second insulating film referred to in the claims. Further, on this occasion, although polybenzoxazole is used in the second insulating film 17, any of other insulating materials such as positive type photosensitive polyimides may be used therein.

Now, when the conductive film 31 is formed by using an easily oxidizable material, in order to prevent oxidation of an end portion of the conductive film 31, it is preferable to cover the end portion of the conductive film 31 by using the second insulating film 17. According to the present embodiment, since the conductive film 31 is formed by a laminated film of ITO film/Ag alloy film/ITO film, by covering the end portion of the conductive film 31, oxidation of the easily oxidizable Ag alloy film can be prevented. However, in a case in which the conductive film 31 is formed by using a hardly oxidizable material, the end portion of the conductive film 31 may remain exposed.

Subsequently, by subjecting the substrate 11 in such state as described above to a bake treatment in an atmosphere of an inert gas such as $N_2$ gas, polybenzoxazole is cured and, also, the moisture and the like contained in the first insulating film 14 and the second insulating film 17 are removed. On this occasion, since a plurality of holes 31a are provided in the conductive film 31 which covers the first insulating film 14 in the peripheral region B, the moisture and the like remaining in the first insulating film 14 are removed by being released through these holes 31a.

Thereafter, in order to remove minute foreign matters, a spin cleaning is performed on the resultant substrate 11 by using purified water and, then, a bake treatment is performed thereon in a vacuum atmosphere. By these performances, the moisture adhered to the first insulating film 14 and the second insulating film 17 is removed. Next, in a state of maintaining a vacuum atmosphere, pre-treatment of the substrate 11 is performed by $O_2$ plasma after being transported to the pre-treatment chamber. Subsequently, in a state of maintaining a vacuum atmosphere, depositions of organic layers which are subsequent steps are performed as described below. By allowing such process as described above to be performed, a step after the bake treatment is maintained in a vacuum atmosphere and, accordingly, adsorption of the moisture and the like to the substrate 11 is prevented; this feature is favorable.

Figure 3:
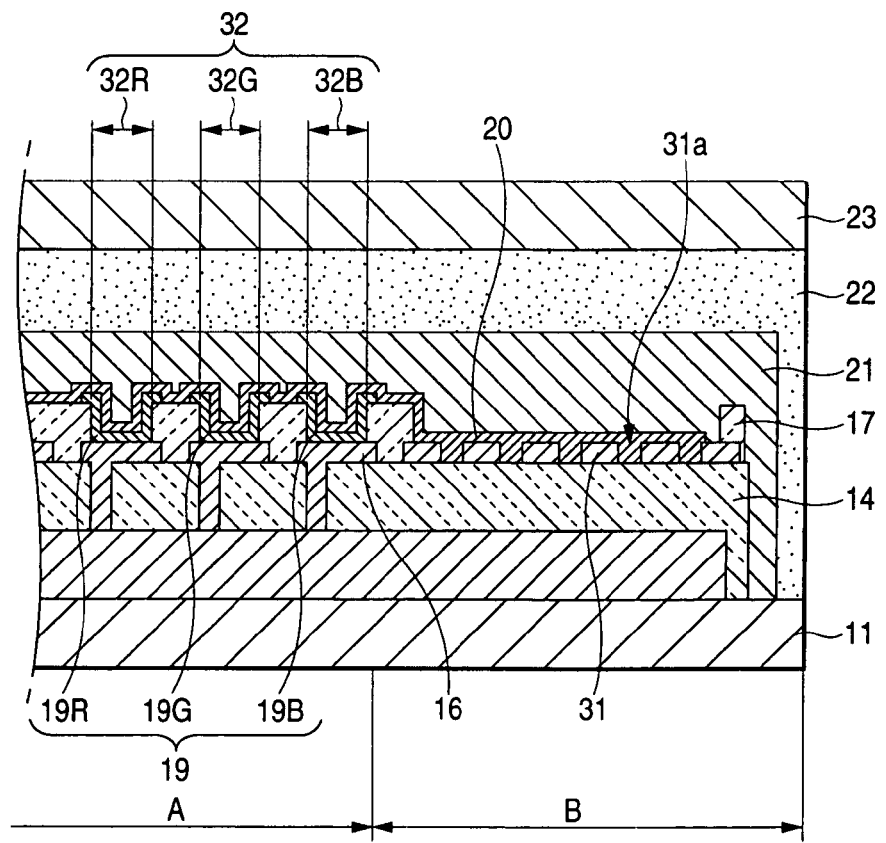
FIG. 3 is a cross-sectional view for explaining a first embodiment according to a production method for a display device of the present invention.

Next, in a state of maintaining the vacuum atmosphere, as shown in FIG. 3, organic layers 19, namely, a red organic layer 19R, a green organic layer 19G, and a blue organic layer 19B in organic EL devices 32 of different colors (red organic. EL device 32R, green organic EL device 32G and blue organic EL device 32B), respectively, are each independently formed on the lower electrode 16 in the pixel opening 18 (refer to FIG. 1A).

In such case as described above, for example, in a vacuum atmosphere, the substrate 11 is transported in a chamber for depositing the blue organic layer 19B, a deposition mask (not shown) is put on the substrate 11 such that it is appropriately aligned therewith and, then, a hole injection layer, a hole transport layer, a light emitting layer and an electron transport layer are deposited in the stated order in a state of covering an inner wall of the pixel opening 18 at a bottom of which the lower electrode 16 is exposed, to thereby form the blue organic layer 19B in a film thickness of about 200 nm.

Next, in a state of maintaining the vacuum atmosphere, the substrate 11 is transported into a chamber for depositing the red organic layer 19R, the depositing mask (not shown) is appropriately aligned on the substrate 11 and, then, the red organic layer 19R is formed in a film thickness of about 150 nm in a same manner as in the blue organic layer 19B.

Thereafter, in a state of maintaining the vacuum atmosphere, the substrate 11 is transported into a chamber for depositing the green organic layer 19G, the depositing mask (not shown) is appropriately aligned on the substrate 11 and, then, the green organic layer 19G is formed in a film thickness of about 100 nm in a same manner as in the blue organic layer 19B.

As described above, after each of the organic layers 19 are formed, in a state of maintaining the vacuum atmosphere, a deposition mask (not shown) is put on the substrate 11 such that it is appropriately aligned therewith and, then, an electron injection layer (not shown) comprising, for example, LiF is formed in a thickness of about 1 nm by, for example, a deposition method on the organic layer 19, the second insulating film 17 and the conductive film 31. Thereafter, by a vacuum deposition method using the thus-formed mask, an upper electrode 20 comprising, for example, a semi-transmissive MgAg alloy is formed in a film thickness of about 10 nm on the electron injection layer. By adopting such constitution as described above, the conductive film 31 and the upper electrode 20 are connected to each other via the electron injection layer.

Next, the deposition mask which has been used at the time of depositing the upper electrode 20 is put on the substrate 11 such that it is appropriately aligned therewith and, then, a transparent conductive layer (not shown) comprising, for example, IZO is formed in a film thickness of 100 nm on the upper electrode 20 by, for example, a sputtering method.

Thereafter, by a CVC method, in a state in which the mask is appropriately aligned, a protective film 21 comprising silicon nitride (SiNx) is formed in a film thickness of 1 μm on the transparent conductive layer. Subsequently, a thermosetting resin 22 is applied on peripheral portions of the protective film 21 and the substrate 11 and, then, a substrate 23 comprising, for example, glass is laminated on the resin 22 and, thereafter, the resultant laminated article is heated as a unity, to thereby perform resin sealing.

By performing the above-described production method, the top-emitting type organic EL display in which light generated in the light-emitting layer of the organic layer 19 is allowed to be reflected at the side of the lower electrode 16 containing the Ag alloy film and, then, drawn out from the side of the upper electrode 20 formed by the semi-transmissive MgAg alloy can be obtained.

According to such production method for the display device as described above and the display device to be obtained by the production method, by performing the bake treatment after the hole 31a which extends to the first insulating film 14 is formed in the conductive film 31 provided in the peripheral region B outside the pixel region A, the moisture and the like contained in the first insulating film 14 is removed by being released through the hole 31a. For this account, the moisture and the like are prevented from remaining in the first insulating film 14 and, accordingly, deterioration of the organic EL device 32 to be caused by the moisture and the like can be prevented.

Therefore, not only reduction of the number of the non-light-emission defects of the organic EL devices 32 can be attained but also a luminescence life time can be prolonged and, further, the drive voltage can be maintained at a low level. Further, without performing a bake treatment at a high temperature or for a long time period, the moisture and the like contained in the first insulating film 14 can be removed in an assured manner; therefore, productivity can be enhanced.

Further, according to the present embodiment, since the lower electrode 16 and the conductive film 31 are formed of a same material, and it is possible to form the lower electrode 16 and the conductive film 31 in a same step and, also, to form the hole 31a to be formed in the conductive film 31 in a same step, the number of production steps is not increased; therefore, an excellent productivity can be attained.

Still further, on this occasion, an example in which the conductive film 31 is formed in a state of a frame surrounding the pixel region A is described; however, the shape of the conductive film 31 is not limited to such shape as described above, and a constitution in which the conductive film 31 in a lengthy stripe shape having a given width is disposed while being connected to the driver circuit such that the pixel region A is sandwiched is permissible in the peripheral region B.

Figure 4:
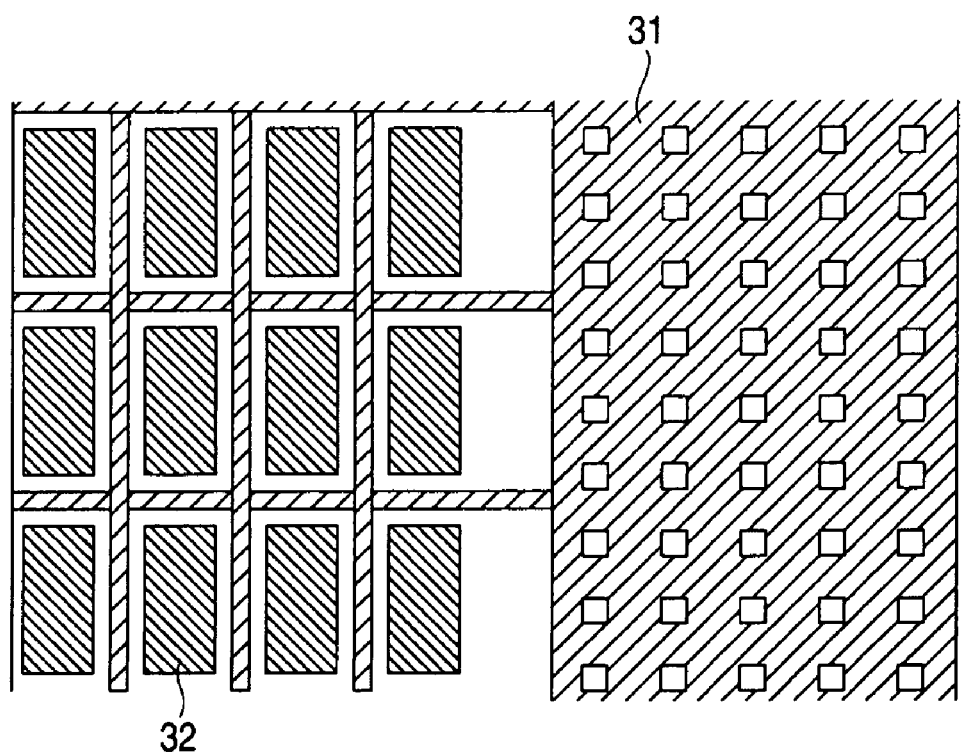
FIG. 4 is a top view for explaining a first embodiment according to a production method for a display device of the present invention.

Even still further, an example in which the conductive film 31 is provided only in the peripheral portion B is described; however, as shown in FIG. 4, a constitution in which the conductive film 31 is provided in a lattice state on the first insulating film 14 between any two pixels each comprising the organic EL device 32 formed in an array manner is permissible. On this occasion, as described with reference to FIG. 1A, when the conductive material layer is formed in a film state on the first insulating film 14 and, then, the lower electrode 16 is formed in an array manner in the pixel region A and, at the same time, the conductive film 31 is formed in the peripheral region B, patterning is performed on the conductive material layer such that it is allowed to be connected to the conductive film 31 in the peripheral region B in a state of being provided between any two pixels in a lattice state.

Second Embodiment

In the first embodiment, the present invention is described by taking a top-emitting type organic EL display as an example. In the present embodiment, a bottom-emitting type organic EL display which draws out light generated in an organic layer from the side of a lower electrode is described with reference to FIGS. 5A and 5B. Same constitutions as those in the first embodiment are explained by giving them with same reference numbers.

Figure 5A:
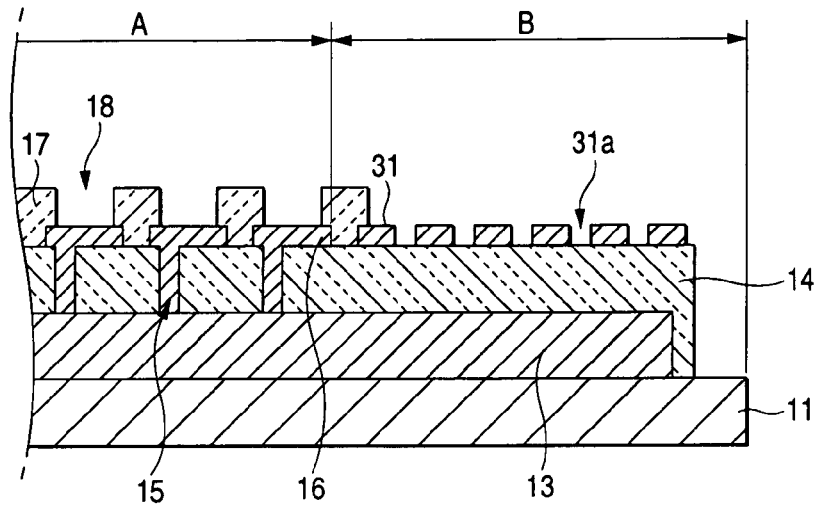
FIG. 5 is a cross-sectional view for explaining a second embodiment according to a production method for a display device of the present invention.

Further, as shown in FIG. 5A, steps in which a first insulating film 14 is formed by coating on a substrate 11 on which a TFT array 13 is formed and, after a contact hole 15 is formed in the first insulating film 14 for being connected to the TFT, the resultant substrate 11 is subjected to a bake treatment are conducted in a same manner as in the first embodiment.

Next, in a state of filling the contact hole 15 by, for example, a sputtering method, a conductive material layer (not shown) comprising, for example, an ITO film is formed in a film state in a film thickness of about 100 nm on the first insulating film 14. Subsequently, patterning is performed on the conductive material layer by etching while using a resist pattern (not shown) formed by an ordinary lithography technique as a mask. By this patterning, a lower electrode 16 which is connected to the TFT via the contact hole 15 and corresponds to each pixel is formed in an array manner on the first insulating film 14 in a pixel region A.

Next, a conductive material layer (not shown) comprising aluminum neodymium (AlNd) which has a higher conductivity than ITO that forms the lower electrode 16 is formed on the first insulating film 14 in a film state in a film thickness of about 300 nm by, for example, a sputtering method. Subsequently, patterning is performed on the thus-formed conductive material layer by etching while using a resist pattern (not shown) formed by an ordinary lithography technique as a mask. On this occasion, although the conductive material layer is formed in a film state also on the lower electrode 16, since AlNd is a material which can take a sufficient etching selection ratio relative to ITO, no problem is generated.

By taking such constitution as described above, a conductive film 31 having a width of about 3 mm is formed in a peripheral region B outside the pixel region A in a state surrounding the pixel region A in a same manner as in the first embodiment and, at the same time, a plurality of holes 31a which extend to the first insulating film 14 are formed on the conductive film 31.

Next, a second insulating film 17 comprising a positive type photosensitive polybenzoxazole is formed by coating on the first insulating film 14 on which the lower electrode 16 is provided by, for example, a spin coat method, subjected to exposure and development and, then, a pixel opening 18 for forming each pixel, namely, an organic EL device is formed in the pixel region A and, then, a surface of the lower electrode 16 is exposed and a surface of the conductive film 31 in the peripheral region B is also exposed. On this occasion, although an end portion of the conductive film 31 is covered by the second insulating film 17 in the first embodiment, since AlNd is not an easily oxidizable material to be used in the present embodiment, the end portion of the conductive film 31 is allowed to remain exposed. Further, on this occasion, although polybenzoxazole is used in the second insulating film 17, any of other insulating materials such as positive type polyimides may be used therein.

Subsequently, a bake treatment is performed on the substrate 11 in such state as described above in an atmosphere of an inert gas such as $N_2$ gas in a same manner as in the first embodiment, to thereby cure polybenzoxazole and, also, remove moisture and the like contained in the first insulating film 14 and the second insulating film 17. At this time, since a plurality of holes 31a are provided in the conductive film 31 which covers the first insulating film 14 in the peripheral region B, the moisture and the like remaining in the first insulating film 14 are removed by being released through these holes 31a.

Thereafter, in order to remove minute foreign matters, a spin cleaning is performed on the resultant substrate 11 by using purified water and, then a bake treatment is performed thereon in a vacuum atmosphere. By these performances, the moisture adsorbed in the first insulating film 14 and the second insulating film 17 is removed. Subsequently, in a state of maintaining the vacuum atmosphere, the resultant substrate 11 is transported into a pre-treatment chamber and subjected to a pre-treatment by using $O_2$ plasma. Then, in a state of maintaining the vacuum atmosphere, depositions of organic layers which are subsequent steps are performed as described below. By performing such steps as described above, since the steps after the bake treatment are performed in a vacuum atmosphere, adsorption of the moisture and the like in the air on the substrate 11 can be prevented; this feature is favorable.

Figure 5B:
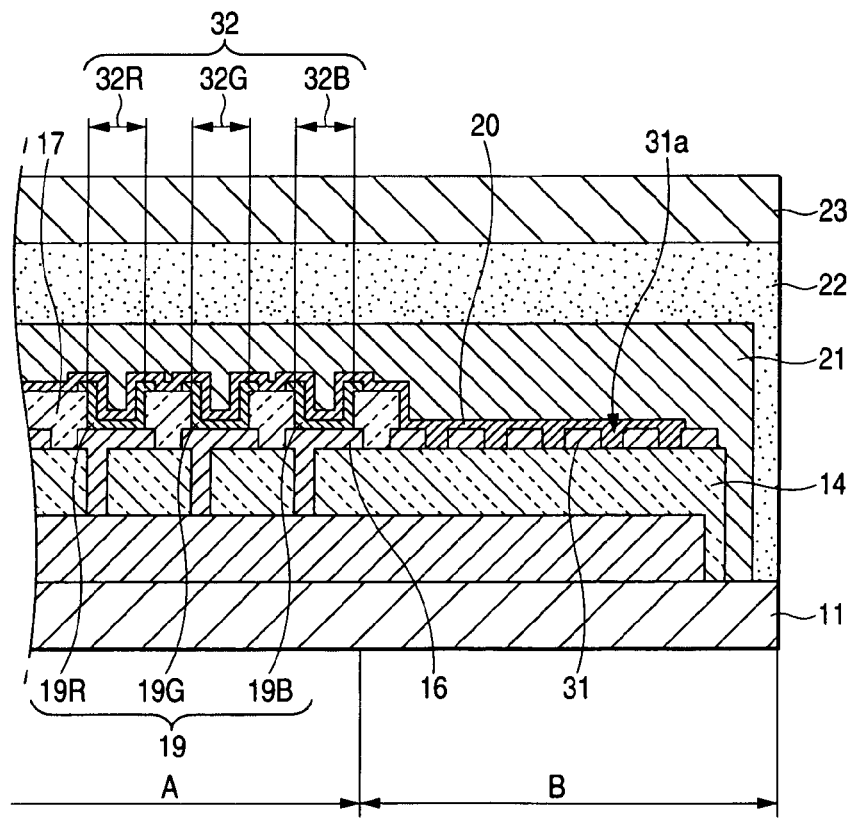

Next, in a state of maintaining the vacuum atmosphere, as shown in FIG. 5B, organic layers 19 (red organic layer 19R, green organic layer 19G and blue organic layer 19B) in organic EL devices 32 of different colors (red organic EL device 32R, green organic EL device 32G and blue organic EL device 32B), respectively, are formed on the lower electrode 16 in the pixel opening 18 in a same manner as in the first embodiment.

Subsequently, in a state of maintaining the vacuum atmosphere, a deposition mask (not shown) is put on the substrate 11 such that it is appropriately aligned therewith and, then, an electron injection layer (not shown) comprising, for example, LiF is formed in a film thickness of about 1 nm on each of the organic layers 19, the second insulating film 17 and the conductive film 31 by, for example, a deposition method. Thereafter, an upper electrode 20 having a reflective property comprising, for example, aluminum is formed in a film thickness of 100 nm on the electron injection layer by a vacuum deposition method using the deposition mask. By such constitution as described above, the conductive film 31 and the upper electrode 20 are connected to each other via the electron injection layer.

Then, in a state of the mask being appropriately aligned, a protective film 21 comprising $SiN_x$ is formed in a film thickness of 1 mm on the upper electrode 20 by a CVC method. Subsequently, a thermosetting resin 22 is applied on peripheral portions of the protective film 21 and the substrate 11 and, then, a substrate 23 comprising, for example, glass is laminated on the resin 22 and, thereafter, the resultant laminated article is heated as a unity, to thereby perform resin sealing.

By performing the above-described production method, the organic EL device in which light generated in the light-emitting layer of the organic layer 19 is allowed to be reflected at the side of the upper electrode 20 comprising Al and, then, drawn out from the side of the lower electrode 16 formed by the transmissive ITO film can be obtained.

Even by such production method and the display device to be obtained thereby as described above, since the hole 31a which extends to the first insulating film 14 is formed in the conductive film 31 provided in the peripheral region B outside the pixel region A, same performance as in the first embodiment can be attained.

Further, according to the present embodiment, by forming the conductive film 31 by using a material having a higher conductivity than the lower electrode 16 and, then, by connecting the conductive film 31 to the upper electrode 20, a wiring resistance is allowed to be reduced and, accordingly, luminance is enhanced and a favorable inner-plane luminance distribution can be obtained.

Further, such production method for forming the conductive film 31 by using a material different from that of the lower electrode 16 as in the present embodiment can be applied to the top-emitting type display device as explained in the first embodiment. However, particularly, in a case of the bottom-emitting type display device having a constitution in which the lower electrode 16 becomes an anode, the ITO film having a transmission property is in many occasions used in the lower electrode 16 and, since the ITO film is a material having a relatively high resistance, it is preferable to form the conductive film 31 by using a material having a higher conductivity than the lower electrode 16.

Modification Example

As described above, in a case of forming the conductive film 31 by using the material having a higher conductivity than the lower electrode 16, the conductive film 31 may be formed on the second insulating film 17. By taking a bottom-emitting type display device as an example, a production method for a display device in this case is described with reference to FIG. 6. On this occasion, a step in which a first insulating film 14 is formed on a substrate 11 on which a TFT array 13 is formed and, after a contact hole 15 for connecting to the TFT is formed in the first insulating film 14, a bake treatment on the substrate 11 is performed is allowed to be performed in a same manner as in the second embodiment as described with reference to FIG. 15A. Further, the constitution up to this point corresponds to the substrate referred to in claims 11 and 14.

Figure 6:
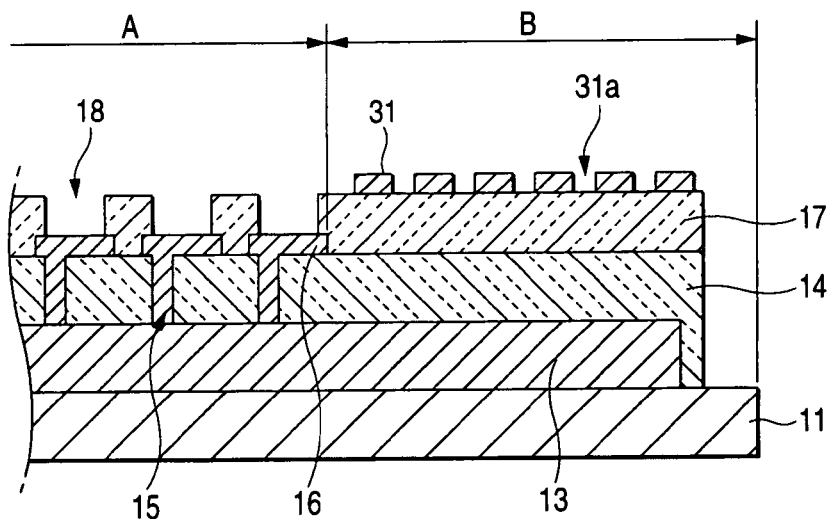
FIG. 6 is a cross-sectional view for explaining an example of modification of a second embodiment according to a production method for a display device of the present invention.

Next, as shown in FIG. 6, in a same manner as in the second embodiment, the lower electrode 16 which is connected to the TFT via the contact hole 15 and corresponds to each pixel is formed in an array manner on the first insulating film 14 in a pixel region A. Subsequently, the second insulating film 17 comprising a positive type photosensitive polybenzoxazole is formed by coating on the first insulating film 14 on which the lower electrode 16 is provided by, for example, using a spin coat method. The thus-formed second insulating film 17 corresponds to the first insulating film referred to in claims 11 and 14. Further, on this occasion, although polybenzoxazole is used in the second insulating film 17, any of other insulating materials such as positive type photosensitive polyimides may be used therein.

Subsequently, exposure and development are performed to form a pixel opening 18 for forming each pixel, namely, an organic EL device 32 in a pixel region A and, then, a surface of the lower electrode 16 is allowed to be exposed. Then, a bake treatment is performed on the substrate 11 in such state as described above in an atmosphere of an inert gas such as $N_2$ gas, to thereby cure polybenzoxazole and, also, remove moisture and the like contained in the first insulating film 14 and the second insulating film 17.

Next, a conductive material layer (not shown) comprising aluminum neodymium (AlNd) which has a higher conductivity than ITO that forms the lower electrode 16 is formed in a film state in a film thickness of about 300 nm by, for example, a sputtering method on the lower electrode 16 and the second insulating film 17. On this occasion, although the conductive material layer is formed in a film state also on the lower electrode 16 which is exposed in the pixel opening 18, since AlNd is a material which can take a sufficient etching selection ratio relative to ITO, no problem is generated.

Subsequently, patterning is performed on the conductive material layer by etching while using a resist pattern (not shown) formed by an ordinary lithography technique as a mask. By this patterning, the conductive film 31 having a width of about 3 mm is formed in a state of surrounding a pixel region A in a peripheral region B outside the pixel region A and, at the same time, a plurality of holes 31a in a state of extending to the second insulating film 14 are formed in the conductive film 31. On this occasion, in the same manner as in the first embodiment, holes 31a each in a rectangular shape having a size of 20.mu.μm.times.20.mu.m are formed in both width and length directions with a space of 100.mu.m between any two adjacent holes in the conductive film 31. Thereafter, the resist pattern is removed.

Thereafter, in order to remove minute foreign matters, a spin cleaning is performed on the resultant substrate 11 by using purified water and, then, a bake treatment is performed on the thus-cleaned substrate 11 in a vacuum atmosphere. By these performances, the moisture adhered to the first insulating film 14 and the second insulating film 17 is removed. On this occasion, since a plurality of holes 31a are provided in the conductive film 31 which covers the second insulating film 17 in the peripheral region B, the moisture and the like contained in the first insulating film 14 and the second insulating film 17 are removed by being released through these holes 31a. Subsequently, in a state of maintaining the vacuum atmosphere, the resultant substrate 11 is transported into a pre-treatment chamber and subjected to a pre-treatment by using $O_2$ plasma. Then, in a state of maintaining the vacuum atmosphere, depositions of organic layers which are subsequent steps are performed as described below. By performing such steps as described above, since the steps after the bake treatment are performed in a vacuum atmosphere, adsorption of the moisture and the like in the air on the substrate 11 can be prevented; this feature is favorable.

The subsequent steps are allowed to be performed in a same manner as in the second embodiment as described with reference to FIG. 3B in a state of maintaining a vacuum atmosphere.

Even by such production method of the display device and the display device to be obtained thereby as described above, since the holes 31a which extend to the second insulating film 17 are formed in the conductive film 31 provided in the peripheral region B outside the pixel region A and, then, the bake treatment is performed on the substrate 11, same performance as in the first embodiment can be attained.

Further, the modification example in which the conductive film 31 is provided on the second insulating film 17 as described above can be applied to the top-emitting type display device as described in the first embodiment. Still further, in a case in which such display device as having the above-described constitution has a constitution in which an auxiliary wiring is formed between any two adjacent pixels as described with reference to FIG. 4, when the conductive material layer is formed in a film state on the second insulating film 14 and, then, patterning is performed to form the conductive film 31 in the peripheral region B in a state of surrounding the pixel region A, the pattering is performed on the conductive material layer such that it is allowed to be connected to the conductive film 31 in the peripheral region B in a state of being provided between pixels in a lattice state.

In the display device as described above, a constitution in which the lower electrode 16 is allowed to be an anode and the upper electrode 20 is allowed to be cathode has been described. However, a constitution in which the lower electrode 16 is allowed to be a cathode and the upper electrode 20 is allowed to be an anode is permissible. On this occasion, organic layers 19 comprising an electron transport layer, a light-emitting layer, a hole transport layer and a hole injection layer being laminated in the above-described order is formed in the pixel opening 18 in which the lower electrode 16 is exposed via an electron injection layer and, then, the upper electrode 20 is formed covering all area of the resultant substrate 11 in such state as described above.

Further, the top-emitting type display device and the bottom-emitting type display device have been described in the first embodiment and the second embodiment, respectively, and, on these occasions, the lower electrode 16 and the upper electrode 20 are both formed of a semi-transmissive material. However, the present invention is also applicable to a display device of a top-and-bottom-emitting type which can draw out emitted light from both of top and bottom sides.

EXAMPLES

The present invention will further be described with reference to specific examples.

Example 1

In a same manner as in the first embodiment, a top-emitting type display device as shown in FIG. 3 was produced. Further, to contrast, a display device in which a conductive film 31 without a hole 31a being provided therein was formed in a peripheral region B of a first insulating film 14 in a width of about 3 mm in a state of surrounding a pixel region A was produced as in the first embodiment.

Figure 7:
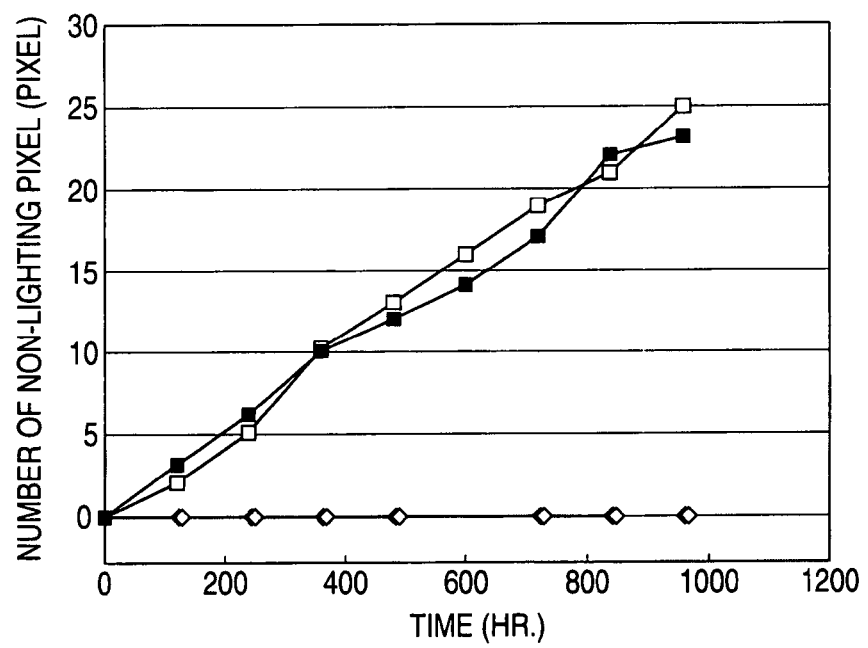
FIG. 7 is a graph illustrating changes along passage of time of numbers of non-lighting pixels in Examples and Comparative Examples.
Figure 8:
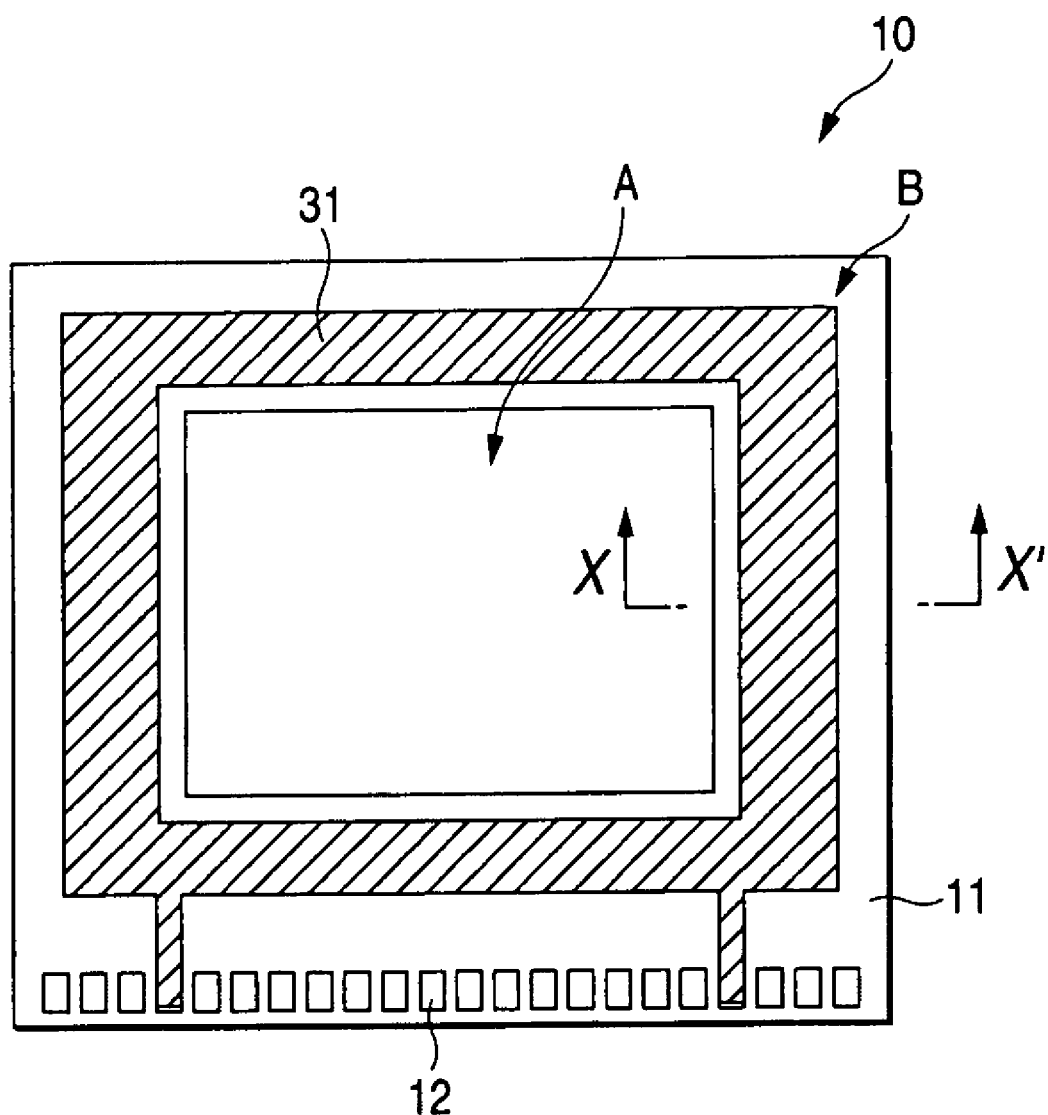
FIG. 8 is a top view for explaining a conventional production method for a display device.
Figure 9A:
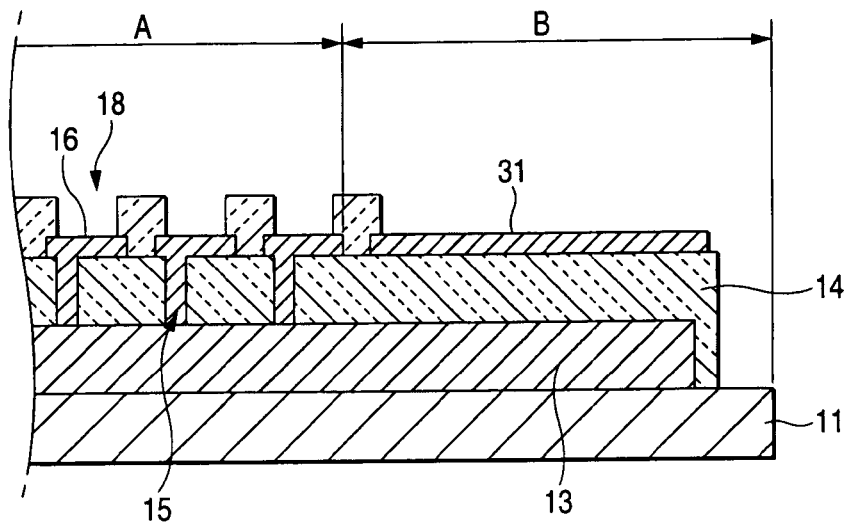
FIG. 9 is a cross-sectional view for explaining a conventional production method for a display device.
Figure 9B:
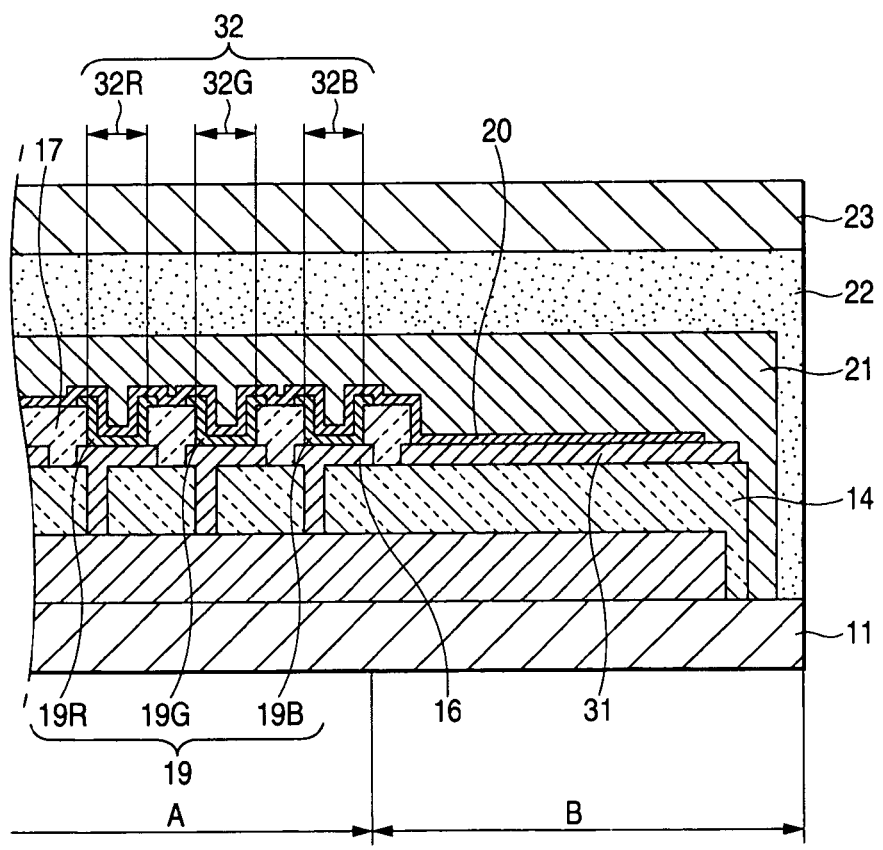

In regard to these display devices, changes of the numbers of non-lighting pixels along the passage of time at the time of storage in a thermostatic unit at 80° C. for about 1000 hours are illustrated in a graph as shown in FIG. 7. In the graph, a storage time and the number of non-lighting pixels are shown in the axis of abscissa and the axis of ordinate, respectively. As the graph shows, it is confirmed that, in the display device in Example 1, the number of non-lighting pixels has not increased even after about 1000 hours elapsed and a favorable image display was able to be obtained, while, in the display device in Comparative Example 1, the number of non-lighting pixels has increased along the passage of time and the image display was deteriorated.

Example 2

In a same manner as in the second embodiment, a bottom-emitting type display device as shown in FIG. 5B was produced. Further, to contrast, a display device in which a conductive film 31 without a hole 31a being provided therein was formed in a peripheral region B of a first insulating film 14 in a width of about 3 mm in a state of surrounding a pixel region A was produced as Comparative Example 2.

In regard to these display devices, changes of the numbers of non-lighting pixels along the passage of time at the time of storage in a thermostatic unit at 80° C. for about 1000 hours are illustrated in a graph as shown in FIG. 7. As the graph shows, it is confirmed that, in the display device in Example 2, the number of non-lighting pixels has not increased even after about 1000 hours elapsed and a favorable image display was able to be obtained, while, in the display device in Comparative Example 2, the number of non-lighting pixels has increased along the passage of time and the image display was deteriorated.

From these results, it is indicated that, in the display device in each of Examples 1 and 2 in comparison with the display device in each of Comparative Examples 1 and 2, since an increase of the number of the non-lighting pixels is prevented, non-emission defects are small in number and the luminescence life time is long.

What is claimed is:

1. A method for making a display device having a pixel region including a plurality of pixels each of which has an organic light emitting device provided on a substrate, the method comprising the steps of:
   a first step of forming a first insulating film on the substrate;
   a second step of (1) forming on the first insulating film in the pixel region, a plurality of lower electrodes respectively corresponding to each of the pixels, (2) forming a conductive film on the first insulating film outside the pixel region, and (3) making a plurality of rectangular holes at substantially even intervals over the entire area of the conductive film which extend through the conductive film to expose the surface of the first insulating film;
   a third step of baking the substrate on which the lower electrode and the conductive film are provided so that moisture contained in the first insulating film is released and eliminated from the first insulating film through the plurality of holes,
   wherein,
      the conductive film surrounds the pixel region in plan view and is connected to an upper electrode to create an auxiliary wiring.

2. The method for making a display device as set forth in claim 1, wherein the lower electrode and the conductive film are formed of the same material.

3. The method for making a display device as set forth in claim 1, comprising the further steps of:
   between the second step and the third step, a step of forming a second insulating film on the first insulating film to cover the lower electrodes and the conductive film, forming a pixel opening on the second insulating film to expose a surface of each of the lower electrodes, and exposing a surface of the conductive film by removing the second insulating film on the conductive film and,
   after the third step, a step of forming an organic layer on the lower electrode, and a step of forming an upper electrode covering the organic layer, the second insulating film and the conductive film, thereby allowing the upper electrode and the conductive film to be connected to each other.

4. The method for making a display device as set forth in claim 3, wherein, in the step of exposing the surface of the conductive film, the second insulating film on the conductive film is removed leaving a part of the second insulating film on the end portion of the conductive film.

5. A display device, which has a pixel region including a plurality of pixels each of which has an organic light emitting device provided on a substrate, the device comprising:
   a first insulating film provided on the substrate;
   a plurality of lower electrodes respectively corresponding to each of the pixels provided on the first insulating film in the pixel region;
   a conductive film provided on the first insulating film outside the pixel region; and
   a plurality of rectangular holes are formed at substantially even intervals over the entire area of the conductive film in the conductive film and which extend through the conductive film and expose the surface of the first insulating film,
   wherein,
      the conductive film surrounds the pixel region in plan view and is connected to an upper electrode to create an auxiliary wiring.

6. The display device as set forth in claim 5, wherein the lower electrode and the conductive film are made of the same material.

7. The display device as set forth in claim 5, further comprising:
   a second insulating film provided on the first insulating film, in which second insulating film a pixel opening for allowing each of such lower electrodes to be exposed is provided;
   an organic layer provided on the lower electrode; and
   an upper electrode covering the organic layer, the second insulating film and the conductive film,
   wherein,
      the upper electrode and the conductive film are connected to each other.

8. The display device as set forth in claim 7, wherein an end portion of the conductive film is covered by the second insulating film.

9. A method for making a display device, which has a pixel region formed by arraying a plurality of pixels, each having an organic layer held in between a lower electrode and an upper electrode on a substrate, the method comprising:
   a first step of forming a plurality of the lower electrodes each corresponding to each of the pixels on the substrate;
   a second step of (1) forming a first insulating film on the substrate to cover the lower electrodes, and (2) forming pixel openings in the first insulating film to expose a surface of each of the lower electrodes;
   a third step of forming a conductive film on the first insulating film outside the pixel region and forming a plurality of rectangular holes at substantially even intervals over the entire area of the conductive film and which extend through the conductive film to expose the surface of the first insulating film; and a fourth step of baking the substrate provided with the conductive film so that moisture contained in the first insulating film is released and eliminated from the first insulating film through the plurality of holes, wherein, the conductive film surrounds the pixel region in plan view and is connected to an upper electrode to create an auxiliary wiring.

10. The method for making a display device as set forth in claim 9, wherein, after the fourth step, an organic layer is formed on the lower electrode, and an upper electrode is formed covering the organic layer, the first insulating film and the conductive film, thereby allowing the upper electrode and the conductive film to be connected to each other.

11. A display device, which has a pixel region including a plurality of pixels, each of which has an organic layer held in between a lower electrode and an upper electrode on a substrate, said display device comprising:

a plurality of such lower electrodes respectively corresponding to each of the pixels provided on the substrate in the pixel region;

a first insulating film provided on the substrate, in which pixel openings allowing each of the lower electrodes to be exposed is provided;

a conductive film provided on the first insulating film outside the pixel region; and a plurality of rectangular holes formed at substantially even intervals over the entire area of the conductive film and extending through the conductive film to expose the surface of the first insulating film are provided, wherein, the conductive film surrounds the pixel region in plan view and is connected to an upper electrode to create an auxiliary wiring.

12. The display device as set forth in claim 11, further comprising:

an organic layer provided on the lower electrode; and an upper electrode provided covering the organic layer, the first insulating film and the conductive film, wherein, the upper electrode and the conductive film are connected to each other.

* * * * *